United States Patent
Le Phan et al.

(10) Patent No.: US 8,593,230 B2
(45) Date of Patent: Nov. 26, 2013

(54) CIRCUIT AND METHOD FOR CORRECTING TEMPERATURE DEPENDENCE OF FREQUENCY FOR PIEZORESISTIVE OSCILLATORS

(75) Inventors: Kim Le Phan, Eindhoven (NL); Jozef Thomas Martinus van Beek, Rosmalen (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/273,704

(22) Filed: Oct. 14, 2011

(65) Prior Publication Data
US 2013/0093525 A1 Apr. 18, 2013

(51) Int. Cl.
*H03B 5/00* (2006.01)
(52) U.S. Cl.
USPC ................. 331/107 R; 331/116 R; 331/154; 331/155
(58) Field of Classification Search
USPC ................. 331/35, 107 R, 116 R, 154, 155
See application file for complete search history.

(56) References Cited

U.S. PATENT DOCUMENTS

| | | | | |
|---|---|---|---|---|
| 5,883,550 A * | 3/1999 | Watanabe et al. | ............. | 331/176 |
| 7,321,272 B2 * | 1/2008 | Neumann | ............. | 331/176 |
| 7,453,324 B2 | 11/2008 | Partridge et al. | ............. | 331/154 |
| 7,649,426 B2 * | 1/2010 | Stolpman | ............. | 331/176 |
| 2006/0125576 A1 | 6/2006 | Ho et al. | ............. | 333/186 |
| 2007/0290764 A1 * | 12/2007 | Partridge et al. | ............. | 331/176 |
| 2009/0167447 A1 * | 7/2009 | Babitch | ............. | 331/66 |
| 2009/0219104 A1 | 9/2009 | Van Beek et al. | ............. | 331/154 |

FOREIGN PATENT DOCUMENTS

WO WO2004053431 6/2004 ............. G01D 1/00

* cited by examiner

*Primary Examiner* — Joseph Chang
*Assistant Examiner* — Jeffrey Shin

(57) ABSTRACT

MEMS oscillators, which include a silicon-type, in particular piezoresistive resonators, can be used to provide a fixed, stable output frequency. Silicon has a natural temperature dependence of Young's modulus, therefore, as ambient temperature changes and/or the piezoresistive resonator is powered, the resonator temperature changes, and the resonance frequency of the resonator drifts. In order to account for the temperature drift of the piezoresistive resonator, the piezoresistive resonator itself is used as a temperature sensor. The relative resistance change of the piezoresistive resonator depends only on the relative temperature change and material property of the resonator. Therefore, an accurate temperature can be sensed directly on the piezoresistive resonator. The temperature drift information is provided to a frequency adjuster, which corrects the output frequency of the circuit.

12 Claims, 5 Drawing Sheets

CIRCUIT AND METHOD FOR CORRECTING TEMPERATURE DEPENDENCE OF FREQUENCY FOR PIEZORESISTIVE OSCILLATORS

Oscillators are widely used in time-keeping and frequency reference applications such as real time clocks, and in digital and telecommunication devices. Quartz crystals are often used to provide high-precision oscillators. Alternatively, Microelectro-mechanical system (MEMS) resonators can be used for oscillation. MEMS resonators can include electrostatic-capacitive resonators, piezoelectric-capacitive resonators, and electrostatic-piezoresistive resonators. The first part of the resonator name (i.e., electrostatic, piezoelectric) refers to the actuation method, whereas the second part (i.e., capacitive piezoresistive) refers to method of detecting the oscillation. A distinction between an electrostatic-piezoresistive (hereinafter called piezoresistive) resonator and the first two types of resonators is that piezoresistive resonators use a piezoresistive detection method, in which a DC current is sent through the resonator structure to readout the signal. During vibration of the resonator, the strain in the structure alters the resistance of the resonator.

Resonators of this sort can be constructed of a silicon material. The resonance frequency of such a resonator changes with temperature. This is an undesired effect, since the output frequency of the oscillator is expected to be stable regardless of changes from environment. The frequency change with temperature is often corrected using a feed-forward mechanism. In such a mechanism, the temperature of the resonator is estimated using a temperature sensor located on the same MEMS die or on the circuit die that contains the oscillator electronics. The sensed temperature is used to adjust the final output frequency of the oscillator based on the measured temperature change. After correction, the final output frequency is stable regardless of ambient temperature changes.

Particular aspects of present disclosure and/or invention are directed to a circuit including circuitry, a set or arrangement of circuits, having a circuit element configured and arranged for resonating and for indicating an operating temperature of the circuit element. In a specific embodiment, an output circuit is configured and arranged with the circuitry (including the circuit element) to provide the operating temperature in the form of an electrical signal for adjusting a frequency output signal that is derived from the at least one circuit element.

Other particular embodiments involve use of MEMS resonators, and in particular use piezoresistive-resonator technology. With piezoresistive resonators, due to the Joule heating effect of a sensing current (the drain current), the temperature of the resonator element is always higher than that of the surroundings. The temperature difference ($\Delta T$) depends on the thermal resistance ($R_t$) of the resonator, the ambient temperature, and the heating resulting of the power (P) supplied to the resonator. If the temperature sensor is placed outside the MEMS resonator, its temperature is usually very close to the ambient temperature. To estimate temperature at the resonator, the temperature difference can be added to the temperature at the sensor. When using this estimation there are many sources of errors. Thermal resistance cannot be accurately defined due to process and assembly variations. Additionally, the thermal resistance may vary significantly from sample to sample. Further, the power measurement can contribute to the error.

In order to more accurately sense the temperature of the resonator, and therefore estimate the temperature drift and the oscillating frequency of the resonator, the resonator resistance itself is measured. In other words, a separate temperature sensor is not needed. The relative resistance change of the resonator body is measured, and the temperature at the resonator is directly calculated. The resonance frequency of a resonator changes with temperature because silicon has natural temperature dependence of Young's modulus (approximately −40 to −60 parts per million (PPM) per Kelvin of temperature change). The resonant frequency of a silicon resonator, which is proportional to the square root of Young's modulus of silicon, therefore drifts approximately negative 20 ppm/K to negative 30 ppm/K. This is referred to as the temperature coefficient of frequency (TCF), and is shown in equation (1).

$$\Delta f / f (\text{in ppm}) = \frac{10^6 [f(T) - f_0]}{f_0} = TCF(T - T_0) \quad (1)$$

Where T is a temperature, and $T_0$ is the reference temperature at which the resonant frequency is $f_0$. The temperature information is provided to a frequency adjuster in order to adjust and correct an output frequency of the resonator based on the temperature change. The accuracy of the output frequency of the resonator is improved, the use of a separate temperature sensor can be eliminated, and the circuit can be simplified as a result.

A resonator with increased accuracy can be used to provide a reference clock signal as opposed to bulky and expensive quartz crystals for high-precision oscillators. The resonator can provide time-keeping and frequency reference application in many devices (e.g., real time clocks, RF modules in mobile phones, devices containing blue-tooth modules, USB modules, and other digital telecommunication devices).

The above discussion is not intended to describe each embodiment or every implementation. The figures and following description also exemplify various embodiments.

Various example embodiments may be more completely understood in consideration of the following detailed description in connection with the accompanying drawings, in which.

Figure 1:
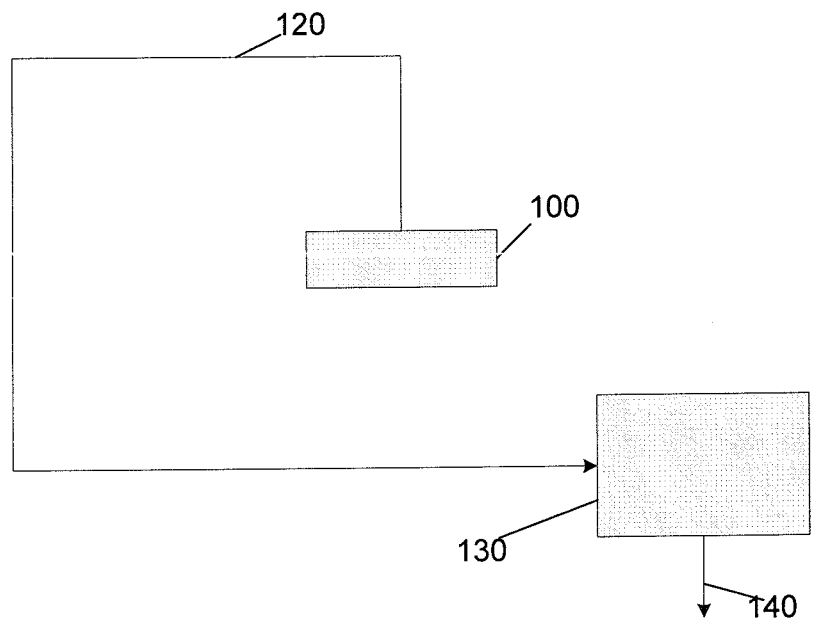
FIG. 1 shows a block diagram of an example embodiment of an oscillator circuit in accordance with the instant disclosure.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

Aspects of the instant disclosure relate to a resonator that does not need to utilize a separate temperature sensor (at a location nearby) to measure the temperature shift of the resonator during oscillation. Rather, the temperature at the resonator can be estimated directly because of the temperature dependent nature of resistance of the applicable semiconductor material. In certain specific implementations, this material can be one of various materials such as silicon (or materials including silicon, e.g., pure silicon, doped silicon material, or silicon material clad with another material such as silicon dioxide), and Germanium (e.g., pure Ge, or Ge-based compounds such as SiGe). To measure the resistance of the resonator, a DC current is sent through the resonator for signal readout. This same current can be used to measure the DC resistance of the device. Therefore, no extra power is needed to sense temperature.

As is the case with many conducting materials, resistance of a silicon-type material is temperature dependent, and based on the formula shown in equation (3).

$$R_d = R_{d0}[1 + \alpha_R(T - T_0)] \quad (3)$$

Where $R_d$ is the resistance of the resonator at temperature T; $R_{d0}$ is the resistance of the resonator element at a reference temperature $T_0$ (e.g., the calibration temperature); and $\alpha_R$ is the temperature coefficient of resistivity (TCR) of the silicon-type material. TCR is dependent on dope type and dope concentration, and is typically a positive number (e.g., 5E-3 $K^{-1}$).

Equation (3) implies that the value of resistance of the resonator element ($R_d$) can be used to deduce temperature of the resonator (T). However, due to process variation, the resistance of the resonator element at a reference temperature ($R_{d0}$) may vary from sample to sample. This makes the relationship between the resistance of the resonator and the temperature of the resonator not well defined. As a result, the absolute value of resistance of the resonator element is not a good measure of temperature of the resonator. Measuring the relative change ($D_R$) of the resonator resistance, with respect to the resistance of the resonator element at a reference temperature, yields a more accurate estimation of the resonator core resistance/temperature. The relative change of the resonator resistance with respect to temperature can be estimated using equation (4).

$$D_R = \frac{R_d - R_{d0}}{R_{d0}} = \alpha_R(T - T_0) = \alpha_R \Delta T \quad (4)$$

This relative change is purely dependent on the TCR ($\alpha_R$) of the material and the difference of the current temperature of the resonator versus the temperature of the resonator prior to operation at a known situation, e.g. at calibration ($T-T_0$). In order to correct for frequency drift, relative temperature change at an operation condition compared to the temperature at calibration is needed rather than the absolute temperature. Moreover, since TCR is a material property that does not change significantly based on a device using a silicon-type material (assuming a homogeneous dope concentration), the relative change of the resistance of the resonator core is a good estimate of the temperature difference, and therefore can be used for frequency correction.

Temperature deduced from the relative change of the resistance of the resonator core is a true estimate of the temperature at the resonator beams where the spring stiffness (thus the resonance frequency) is defined. Rather than estimating the temperature at a location nearby the resonator, the temperature change is measured at the source. Further, determining the temperature in this manner includes both the influence of ambient temperature and temperature increase due to current heating.

The change in resistance due to temperature is considered a DC signal, while the change in resistance due to vibration happens at much faster speed (e.g., MHz range). Therefore, the two kinds of signals (DC and AC) can easily be split in a readout circuit. For the purpose of temperature measurement, only the DC component of resistance is significant.

The circuits and the methods of the instant disclosure operate using a resonating oscillator. Being that piezoresistive materials are temperature dependent, the circuits and methods measure the temperature of the resonator directly from the resonator, and adjust a frequency output based upon the temperature shift of the material (e.g. a piezoresistive material).

In an example embodiment, an oscillator circuit includes at least one circuit element. The at least one circuit element is designed for resonating. That same element is also designed for indicating its operating temperature. In certain specific embodiments, the element is characterized as a piezoresistive resonator. The oscillator circuit also includes an output circuit, which provides the operating temperature in the form of an electrical signal. In certain specific embodiments, the electrical signal can be a current signal, a voltage signal, or a resistance signal. The electrical signal is provided to adjust a frequency output signal that is derived from the at least one circuit element. In certain embodiments, the oscillator circuit can sense the operating temperature of the at least one circuit element accurately within 3 Degrees Centigrade.

In another example embodiment, an oscillator circuit includes a resonator and a temperature sensing circuit. The temperature sensing circuit provides at least one temperature-expressed signal indicative of a temperature of the resonator while the resonator is oscillating. The resonator can be made from a material such as silicon. The resonator often is described as piezoresistive. The temperature sensing circuit additionally generates an oscillation output signal. Further included in the oscillator circuit is an output circuit. The output circuit of the instant embodiment provides a frequency output signal. The frequency output signal is a function of the at least one temperature-indicative signal and the oscillating output signal generated by the resonator. In certain specific embodiments, the oscillator circuit can further include a sustainer circuit that sustains the oscillator of the resonator. In certain specific embodiments, the output circuit includes a Phase Locked Loop (PLL).

The instant disclosure is additionally directed towards an oscillator circuit that includes a resonator, often a piezoresistive resonator, and a temperature sensing circuit. The temperature circuit is designed to sense the temperature of the resonator. The circuit also includes a signal converting circuit that converts the sensed temperature to an adjustment signal, and to use the adjustment signal to provide a frequency output signal. The frequency output signal is derived from the resonator, and accounts for temperature-induced changes to the resonator. Often, the frequency output signal provides a reference clock to an electronic device. In certain specific embodiments, the signal converting circuit includes a frequency counter to determine the current oscillating frequency of the resonator. In other specific embodiments, the frequency counter is included in the temperature sensing circuit.

In an example embodiment, a method is provided which includes an oscillator circuit, the oscillator circuit including at least one circuit element. The at least one circuit element is often a piezoresistive resonator. The at least one circuit element resonates and indicates its operating temperature, thus sensing a temperature of the resonator. The method further operates by providing the sensed temperature in the form of an electrical signal for adjusting a frequency output signal that is derived from the resonator. In certain specific embodiments, the electrical signal that can be a current, a voltage, or a resistance signal. Moreover, in certain other embodiments, the sensed temperature includes sensing the current and voltage signal through the resonator.

In another example embodiment, a method is provided in an in an oscillator circuit. The oscillator circuit includes at least one circuit element for resonating and indicating an operating temperature of the at least one circuit element. The method is further characterized by sensing a temperature of the at least one circuit element. The method operates by converting the sensed temperature to an adjustment signal, and using the adjustment signal to provide a frequency output signal. The frequency output signal is derived from the oscillating resonator, and accounts for temperature-induced changes to the resonator. In certain specific embodiments, the method described is further characterized as providing the sensed temperature in the form of an electrical (e.g., current, voltage, resistance). Moreover, in certain embodiments, the sensed temperature is converted via Analog-to-Digital converter (ADC) and logic circuitry.

Figure 2:
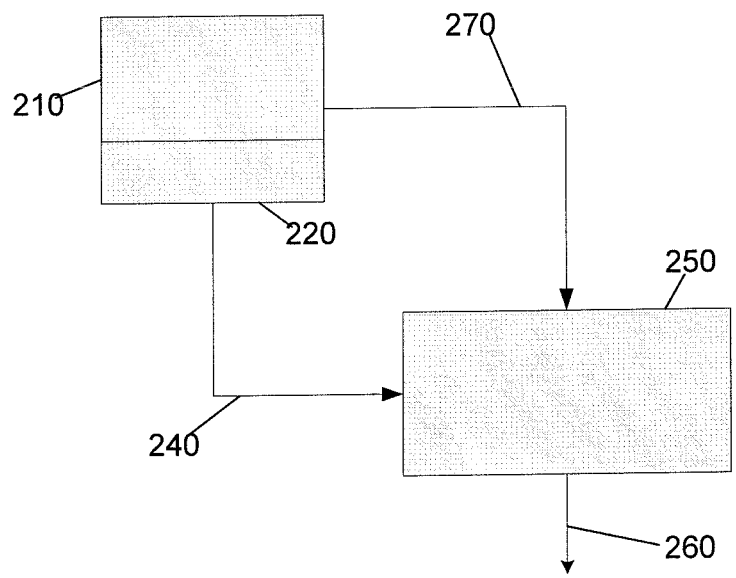
FIG. 2 shows a block diagram of another example embodiment of an oscillator circuit.

Turning now to the figures, FIG. 1 shows a block diagram of an oscillator circuit in accordance with an example embodiment of the instant disclosure. The oscillator circuit includes at least one circuit element 100, the at least one circuit element 100 being designed for resonating. The at least circuit element 100 is often a piezoresistive resonator. The at least one circuit element 100 also is designed to indicate an operating temperature of the element 100. The operating temperature is provided to an output circuit 130 in the form of an electrical signal 120 (e.g., current, voltage, resistance). The output circuit 130 adjusts a frequency output signal 140 based on the sensed temperature from the at least on circuit element 100. In one example implementation, the sensed operating temperature of the oscillator circuit is accurate within 1 Degree centigrade. In another example implementation, the sensed operating temperature is accurate within 3 Degrees Centigrade Referring now to FIG. 2, which shows an oscillator circuit in accordance with another example embodiment, an oscillator circuit is shown having a resonator 220 and a temperature sensing circuit 210. The resonator 220 is often a silicon-based material, and can be piezoresistive. The resonator 220 is typically made from a material that includes silicon. In certain specific embodiments, the oscillator circuit further comprises a sustainer circuit that maintains the oscillation of the resonator 220. The resonator 220 oscillates and generates an oscillating output signal 240, which is in turn provided to an output circuit 250. The resonator 220 also provides at least one temperature-expressed signal 270 to the output circuit 250. The at least one temperature-expressed signal 270 is indicative of the temperature of the piezoresistive resonator 220 while the piezoresistive resonator 220 is resonating and generating the oscillating output signal 240. The output circuit 250 provides a frequency output signal 260 based on at least one temperature-expressed signal 270 and the oscillating output signal 240. In certain embodiments, the output circuit includes a Phase Locked Loop (PLL).

Figure 3:
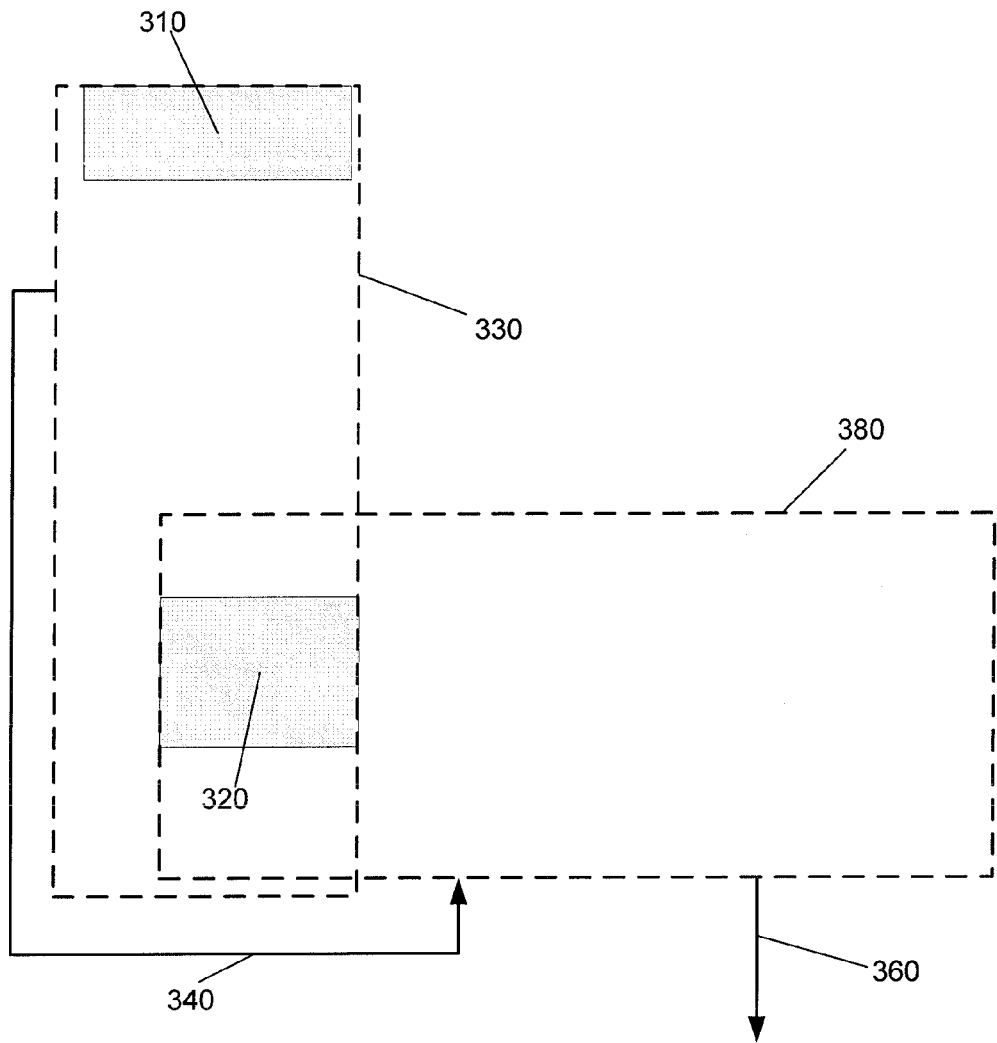
FIG. 3 shows another example embodiment an oscillator circuit as a block diagram.

Turning now to FIG. 3, which shows another example embodiment of an oscillator circuit that includes a resonator 310 and a temperature sensing circuit 330. The temperature sensing circuit 330 senses a temperature of the resonator 310. Also integrated in the circuit is a signal converting circuit 380. In certain specific embodiments, the signal converting circuit 380 includes a frequency counter 320 which determines the current oscillating frequency of the oscillating piezoresistive resonator 330. In other embodiments, the temperature sensing circuit 330 can include the frequency counter 320. This is shown in the overlapping block diagram of the temperature sensing circuit 330 and signal converting circuit 380. The signal converting circuit 380 converts the sensed temperature to an adjustment signal 340, and uses the adjustment signal 340 to provide a frequency output signal 360. The frequency output signal 360 is further characterized in that it is derived from the resonator 330. Further, the output signal 360 takes into account the temperature induced-changes of the resonator 310. The frequency output signal 360 can be used to provide a stable reference clock signal to electronic devices (e.g., real time clocks, RF modules in mobile phones, devices containing blue-tooth modules, USB modules, and other digital telecommunication devices).

Figure 4:
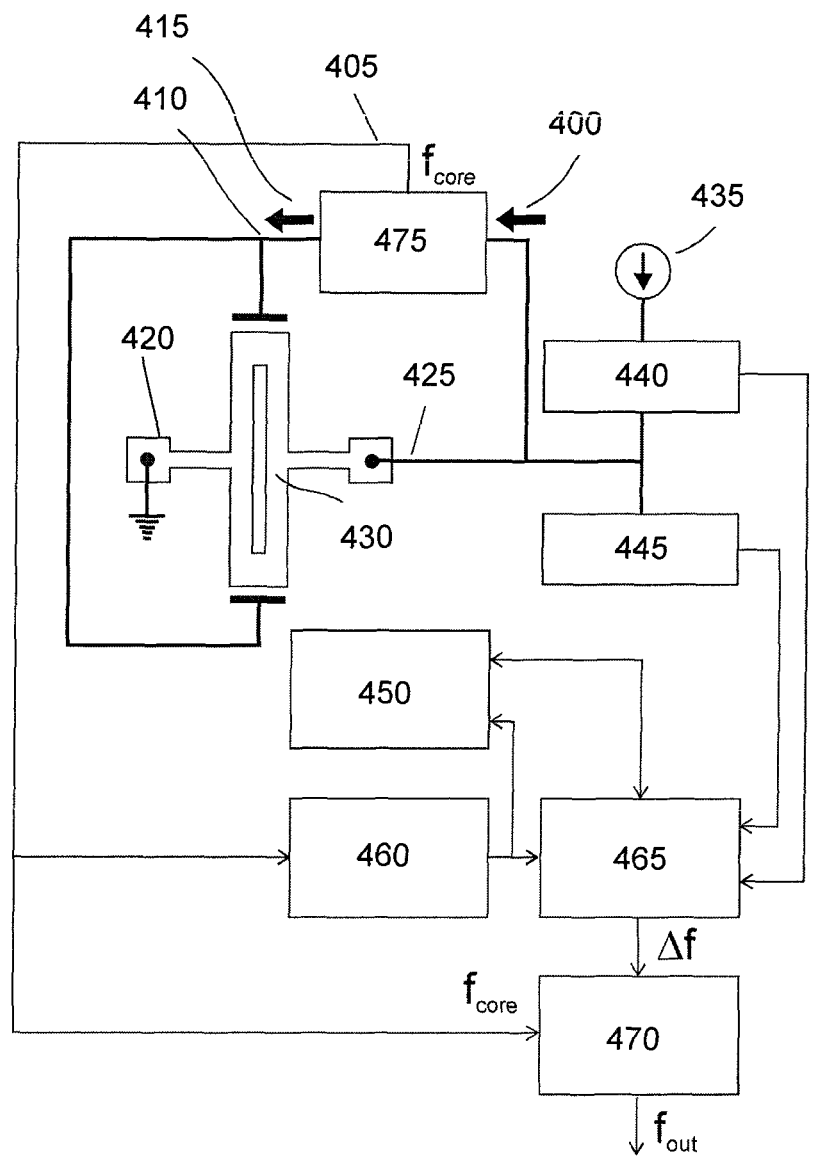
FIG. 4 shows another example embodiment of an oscillation circuit.

Turning now to FIG. 4, which shows a circuit in an example embodiment according with the instant disclosure. FIG. 4 shows a schematic diagram of a piezoresistive resonator 430 in a microelectrical-mechanical system (MEMS). The piezoresistive resonator 430 can have a shape of an elongated bar with a slit in the middle, or in other specific embodiments, the piezoresistive resonator 430 can be shaped similar to a dog-bone with a slit in the middle. The dog-bone structure is characterized in that two ends expand to create the "heads" of the dog-bone. A typical thermal resistance of a dog-bone resonator is about 7 K/mW. With a drain power of 2 mW dissipated in the resonator element, the temperature difference is 14 K. The piezoresistive resonator 430 can further be in the shape of a ring with four anchors, or any other types of piezoresistive MEMS resonators. The piezoresistive resonator 430 can be made from any of a number of material types, for which there is a sufficiently-large piezoresistive coefficient (see, e.g., above-discussed Si-based, or Ge-based materials). Silicon dioxide has a positive Young's modulus as opposed to that of silicon, which has a negative Young's Modulus. Therefore, the composite structure of silicon and silicon dioxide can effectively lower TCF or reduce it to virtually zero. In this case, the temperature correction as described is used to correct for the remaining non-zero TCF, for applications in which precise oscillation is required.

The circuit shown in FIG. 4 shows the resonator 430 (e.g., a piezoresistive resonator) connected to three terminals. The resonator 430 is connected to: an input terminal 410 for actuation, which is connected to at least one electrode; an output terminal 425 for sensing, connected to at least one anchor; and a ground electrode 420, connected to another anchor. An oscillator circuit core 475 is coupled to the resonator 430 to form a closed oscillation loop. The oscillator circuit core 475 receives an AC sensing signal 400 from the output 425 of the resonator 430, and amplifies the signal. An actuation signal 415 is then fed back to the input terminal 410 of the resonator circuit with the desired phase and amplitude to sustain the oscillation. The oscillator circuit 475 outputs a core oscillator output signal 405, which is a signal representing the oscillation of the piezoresistive resonator 430.

In order to sense the core oscillation output signal 405 from the resonator 430, a constant current is provided by a current source 435. The current from the current source 435 flows through the resonator element to ground terminal 420. The AC sensing signal 400 obtained at the output terminal 425 of the resonator 430 is a voltage-modulated signal. Alternatively, the output signal body can be sensed by applying a constant voltage on the resonator with a voltage source. The AC sensing signal 400 obtained at the output terminal 425 of the resonator is a current-modulated signal. This AC sensing signal 400 is fed into the core oscillation circuit 475 and returned back to the input terminal 410 of the resonator 430 to form a closed oscillation loop.

To measure the temperature of the resonator 430, the DC component of the resistance of the resonator 430 is measured. The DC resistance ($R_d$) of resonator 430 is measured by a DC current circuit 440 and a DC voltage circuit 445 coupled to the resonator 430. The current ($I_d$) can be measured, for example, using a measuring voltage drop on a fixed resistor connected in series in the circuit, or by using a current mirror. Alternatively, the current can be set fixed by design and the known value can be used later in a calculation step. The voltage ($V_d$) at the output terminal 425 can be measured, for example, by comparing a band-gap reference voltage. The values of the DC current and DC voltage are provided to a calculation circuit 465 where the resistance of the resonator 430 is calculated.

Predefined material parameters (e.g., TCF, TCR) are stored a memory circuit 450 and are used by the calculation circuit 465. The reference frequency of the resonator 430 at calibration is stored in a memory circuit 450 of the device, and provided to the calculation circuit 465 during calculation.

The calculation circuit 465 outputs frequency shift $\Delta f$. The frequency shift, calculated with respect to the reference frequency, is the shift the resonator 430 oscillation frequency has undergone when the resonator 430 deviates from the temperature at calibration. Using the frequency shift $\Delta f$, a frequency adjuster circuit 470 continuously adjusts an output frequency ($f_{out}$) to the desired and fixed oscillation value. The frequency adjuster circuit 470 can be, for example, a Phase Locked Loop (PLL) such as sub-types digital- or fractional-N PLL, a Direct Digital Synthesizer (DDS), or any type of frequency synthesizer. Alternatively, the frequency adjuster 470 can be a another means to adjust the oscillation frequency, such as the spring softening effect in which the frequency of the resonator can be adjusted with the DC bias voltage applied on the gate (see, e.g., the related mechanism and approach taught in US20060125576 which is incorporated by reference). In certain embodiments, a frequency counter 460 can be added to the circuit to determine the current frequency of the resonator 430. The output frequency of the oscillator circuit is temperature-independent.

Figure 5:
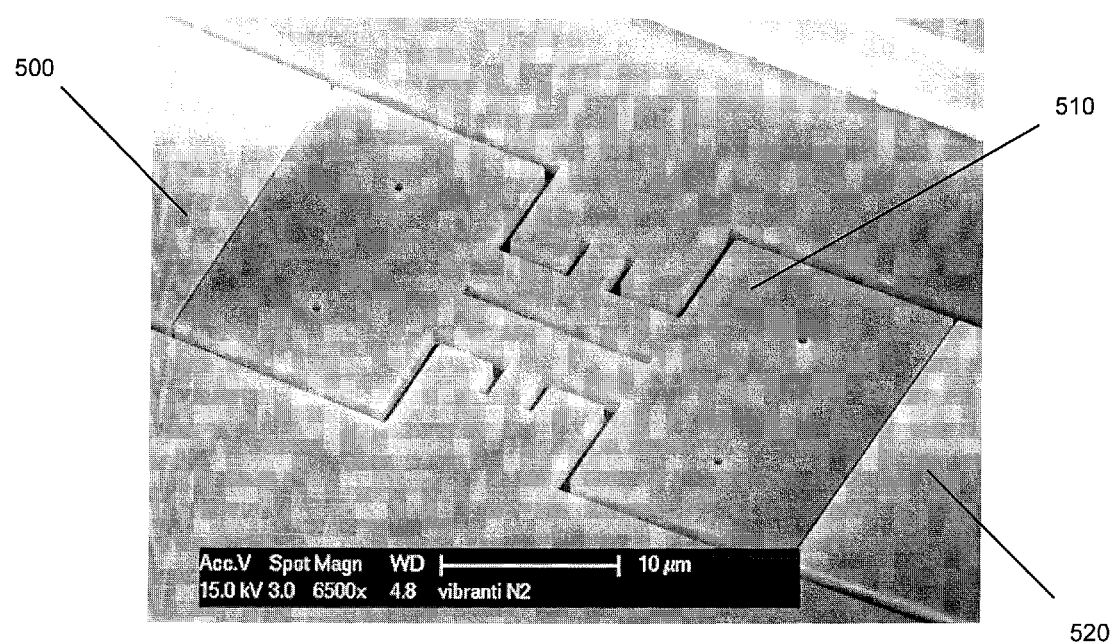
FIG. 5 shows a three-dimensional image of a resonator in accordance with an embodiment of the instant disclosure.

FIG. 5 shows a piezoresistive resonator 510 of an example embodiment of the instant disclosure in a three-dimensional resolution image. In this embodiment, the piezoresistive resonator 510 is shaped to a dog-bone with a slit in the middle and two expanded heads. The piezoresistive resonator 510 is connected to two electrodes 500 and 520.

In some cases such as when the piezoresistive resonator is made of only doped silicon, the values of TCF and TCR of the material are well defined and known. Thus, there is no need to measure TCF and TCR during the calibration step. When TCF and TCR are well defined, the calibration of the piezoresistive resonator is switched on at a constant temperature (e.g., room temperature), and the drain power in the resonator is set to a working value. After waiting a short time for temperature of the resonator element to stabilize, the frequency at the output of the oscillator core ($f_{core}$), is measured, denoted for this example as $f_0$. The frequency is measured using a frequency counter and an external precise clock. The measured frequency is stored in the memory element of the circuit. The DC current ($I_d$) and DC voltage ($V_d$) are then measured. In a calculation circuit, the measured frequency is compared to the target (desired) frequency and the difference is calculated. The difference between the measured frequency and the desired frequency is provided to the frequency adjuster (e.g., a PLL), which adjusts its output to the target (desired) frequency. The resistance of the piezoresistive resonator element ($R_{d0}$) at the calibration is calculated from $I_d$ and $V_d$, ($R_{d0}=V_d/I_d$), and the value is stored in the memory of the circuit.

During operation of a circuit where the material properties of the piezoresistive resonator are well known, any change in the ambient temperature and/or power will result in a change in the temperature at the resonator, and thus a change in the frequency of the oscillator. The change in the temperature ($\Delta T$) at the beams (with respect to the calibration) is reflected by the change in its resistance $R_d$ according to equation (4), detailed above.

A number of calculations are made in order to correct for the frequency drift. First, in the manner described above, at predefined intervals of time, $I_d$ and $V_d$ are measured, and $R_d$ is calculated. Next, the relative change ($D_R=(R_d-R_{d0})/R_{d0}$) is calculated using the value of $R_{d0}$ in the memory. Using equation (4), the temperature difference $\Delta T$ is calculated using the known value of $\alpha_R$, which is stored in the memory. The relative frequency shift ($D_f$) in parts per million (PPM), with respect to frequency at the calibration temperature ($f_0$), is calculated using equation (5).

$$D_f = \frac{\Delta f}{f} = TCF \times \Delta T, \qquad (5)$$

Based on the relative frequency shift and the oscillation frequency of the piezoresistive resonator core at the calibration frequency ($f_0$), the true frequency of the oscillator core at temperature T during operation can be predicted, as shown in equation (6).

$$f_T = f_0(10^{-6}D_f + 1) \qquad (6)$$

The frequency shift ($\Delta f$) of the piezoresistive resonator is calculated ($\Delta f = f_T - f_0$) based on the above calculated predicted frequency ($f_T$) and the known calibration frequency ($f_0$). The frequency shift is provided to a frequency adjuster, and the final output frequency of the resonator is corrected to again obtain the desired frequency of oscillation.

It is assumed that both TCR and TCF function linearly with temperature. However, the material functions are slightly nonlinear with small higher order terms. In certain embodiments, a silicon piezoresistive resonator is clad with a layer of a positive-TCF material (e.g., silicon dioxide). Adjusting the clad thickness adjusts the effective TCF of the composite structure. Ideally, the targeted TCF should be zero, however, due to process variation, the target is often missed. As a result, a portion of non-zero TCF remains, which may change from sample-to-sample. The non-zero value of the TCF can be corrected by first defining TCF for each sample using a calibration step, as described below.

The calibration of a circuit using a TCF that is not well defined for a piezoresistive resonator can be accomplished in two ways: using multiple power values and using alternated power values.

Figure 6:
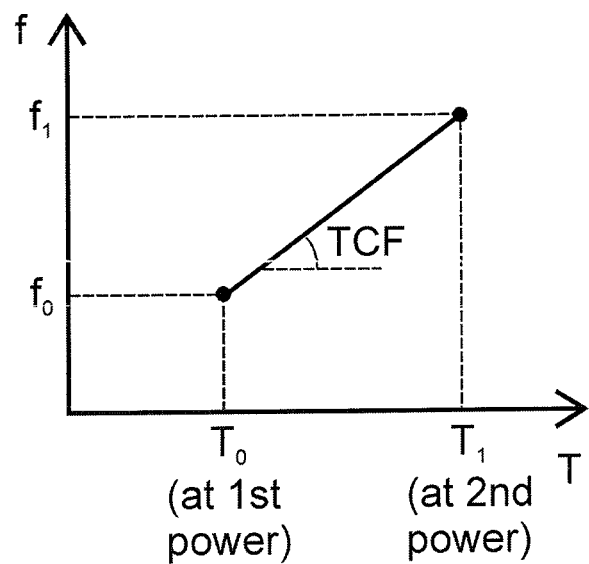
FIG. 6 shows a first calibration option for a piezoresistive resonator with a TCF that is not well defined.

During calibration using multiple powers, a first power value is applied to the resonator element. The power is the product of the drain current ($I_d$) and the drain voltage ($V_d$). The frequency at the output of the resonator ($f_0$) and resistance ($R_{d0}$) are measured in a manner similar to the measurements of a resonator with a well defined TCF and TFR, as described above. A second power value is applied to the resonator. The second power is considerably different than the first power value. The change in power is accomplished by altering the drain current and/or the drain voltage. At the second power value, due to the change in Joule heating, temperature at the resonator is different, and therefore, so is the frequency. A first frequency ($f_1$) and resistance ($R_{d1}$) are measured. From the relative change in resistance (($R_{d1}-R_{d0}$)/$R_{d0}$), and the known TCR, the temperature difference $\Delta T$ between the two power settings is calculated. Therefore, the relative frequency shift can be calculated: $D_f=(f_1-f_0)/f_0$. The TCF value is derived based on the frequency shift and the change in temperature (TCF=$D_f/\Delta T$), and is stored in the memory, together with $f_0$ and $R_{d0}$. An illustration of the calibration is shown in FIG. 6. To increase accuracy, more than two power values can be set sequentially. By having more than two measurement points, the nonlinear behavior (i.e., higher ordered terms in the frequency vs. temperature curve) of TCF can be defined.

Figure 7:
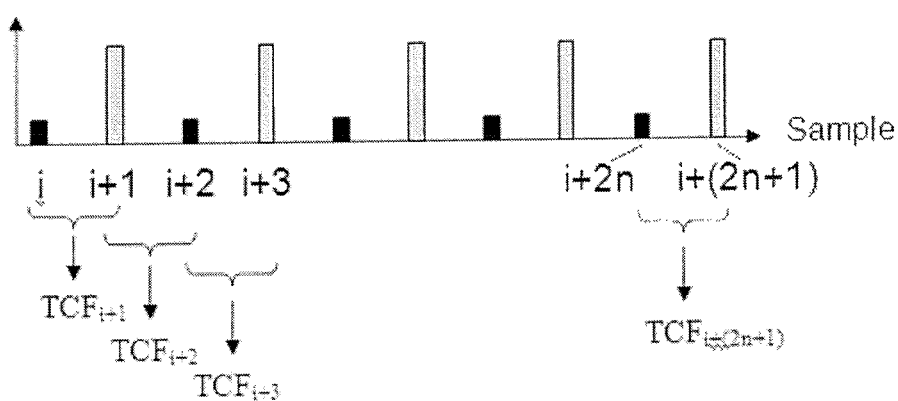
FIG. 7 shows a second calibration option for a piezoresistive resonator with a TCF that is not well defined.

In a second calibration option for a resonator core with a TCF that is not well defined, alternating power values are used. At a fixed ambient temperature and in the testing phase of a mass production line, two different drain power values are set alternatively from one sample to the next. For example, for sample number i, a first power (P1) is set. The frequency and drain resistance are measured after the power is set. The drain resistance is temporarily stored in external equipment (e.g., the tester). For the next sample (i+1), a second power (P2) is set, and again, frequency and resistance are measured and stored. The TCF value of sample number i+1 can be defined from measurement results of samples i and i+1, and stored in sample i+1. It is required that consecutive oscillator samples contain adjacent MEMS resonator dies (adjacent locations on a same wafer) because process variation may vary at relatively large distances. It is assumed that properties of sample i are very close to those of sample i+1. Therefore, the TCF calculation based on two adjacent dies is reasonably accurate. FIG. 7 shows a graphic detailing the second calibration option for a resonator core with a TCF that is not well defined.

Using alternative power calibration, the calibration time can be cut in half, resulting in lower testing cost. However, the accuracy of alternative power calibration is slightly worse than the two power point calibration.

During operation of a piezoresistive resonator with a TCF that is not well defined using either calibration described above, the frequency shift is derived in the same manner as described with respect to a piezoresistive resonator having a TCF and a TCR that are well defined. The TCF value of each sample is retrieved from the memory, rather than a predefined fixed value.

When both TCF and TCR are not well defined, it is not possible to calculate a temperature change between power values during calibration based on resistance change. Therefore, a method of two-temperature calibration is preferred. During two-temperature calibration, a small fixed drain power is used. This power should be as small as possible, only enough to sustain stable oscillation. At a first ambient temperature, oscillation frequency and resistance ($R_d$) of the resonator element are measured. The difference in temperature between environment and the resonator beams due to Joule heating is estimated based on a known thermal resistance, and the power supplied. The real temperature ($T_0$) of the piezoresistive resonator at the first ambient temperature is equal to the ambient temperature plus the temperature difference between the ambient and the resonator temperatures. While the power is still at the low value, the ambient temperature is changed to a second temperature value, and the same procedure as above is repeated. Based on the relative changes in frequency, resonator temperature, and drain resistance between the two temperature points, the TCR and the TCF are calculated and stored in the memory.

In two-temperature calibration, only the relative change in the resonator temperature between the two ambient temperature settings is of interest. Therefore, the error due to wrong estimation of thermal resistance and power during calculating the temperature raise of the resonator can be minimized or virtually eliminated. An alternated temperature calibration, similar to the alternated power calibration described above, can also be used in this instance, where two different ambient temperatures are alternatively set for adjacent samples instead of alternating the power.

During operation of a resonator having a TCF and a TCR value that are both not well defined prior to calibration, the frequency shift is derived in the same way as with the previous resonators, however, the TCF and TCR values of each sample are retrieved from the memory.

Any combinations of multiple-power, multiple-temperature, alternated power, alternated temperature calibrations are possible for calibration of a piezoresistive resonator.

Based upon the above discussion and illustrations, those skilled in the art will readily recognize that various modifications and changes may be made without strictly following the exemplary embodiments and applications illustrated and described herein. Furthermore, various features of the different embodiments may be implemented in various combinations. Such modifications do not depart from the true spirit and scope of the present disclosure, including those set forth in the following claims.

What is claimed is:

1. An oscillator circuit comprising:
   a resonator configured and arranged to oscillate resistivity of a circuit path through the resonator and generate an oscillation output signal passing through the circuit path;
   a temperature sensing circuit, configured and arranged to provide at least one temperature-expressed signal indicative of a temperature of the resonator as a function of a resistance-dependent signal passing through the circuit path; and
   an output circuit configured and arranged to provide a frequency output signal, as a function of the at least one temperature-expressed signal and the oscillation output signal generated by the resonator.

2. The oscillator circuit of claim 1, the oscillator circuit further comprising a sustainer circuit configured and arranged to sustain oscillation of the resonator.

3. The oscillator circuit of claim 1, wherein the resonator includes silicon.

4. The oscillator circuit of claim 1, wherein the output circuit includes a Phase Locked Loop (PLL).

5. The oscillator circuit of claim 1, wherein:
   the resonator is a piezoresistive resonator;
   the oscillation output signal is an AC component of a current passing through the piezoresistive resonator; and
   the resistance-dependent signal is a DC component of the current passing through the piezoresistive resonator.

6. An oscillator circuit comprising:
   a resonator and a temperature sensing circuit, the temperature sensing circuit configured and arranged to sense a temperature of the resonator as a function of a resistance-dependent signal passing through the resonator; and
   a signal converting circuit configured and arranged to convert the sensed temperature to an adjustment signal and to use the adjustment signal to provide a frequency output signal that is derived from an oscillation signal passing through the resonator, and that accounts for temperature-induced changes to the resonator.

7. The oscillator circuit of claim 6, wherein:

the resonator is a piezoresistive resonator;

the oscillation signal is a AC component of a current passing through the piezoresistive resonator; and the resistance-dependent signal is a DC component of the current passing through the piezoresistive resonator.

8. The oscillator circuit of claim 6, wherein the signal converting circuit includes a frequency counter to determine a frequency of the oscillation signal passing through the resonator.

9. The oscillator circuit of claim 6, wherein the temperature sensing circuit includes a frequency counter to determine a current oscillating frequency of the resonator.

10. The oscillator circuit of claim 6, wherein the frequency output signal provides a reference clock to an electronic device.

11. A method comprising:

in an oscillator circuit including at least one circuit element configured and arranged to resonate and indicate an operating temperature of the at least one circuit element, sensing a temperature of the at least one circuit element as a function of a resistance-dependent signal passing through the at least one circuit element and indicative of the resistance manifested by the at least one circuit element to indicate a sensed temperature;

providing the sensed temperature in a form of an electrical-adjustment signal for adjusting a frequency output signal that is derived from the at least one circuit element; and wherein:

the sensing of the temperature of the at least one circuit element includes separating the resistance-dependent signal passing through the at least one circuit element into a DC component and an AC component, the DC component indicative of changes in resistance due to temperature and the AC component indicative of changes in resistance due to resonation of the at least one circuit element.

12. The method of claim 11, wherein the resonator is a microelectro-mechanical system resonator.

\* \* \* \* \*